United States Patent [19]
Williamson et al.

[11] Patent Number: 6,163,058
[45] Date of Patent: Dec. 19, 2000

[54] DIFFERENTIAL DEVICES AND DIFFERENTIAL TRANSCEIVER

[75] Inventors: Jon R. Williamson; Derwin W. Mattos, both of San Jose, Calif.

[73] Assignee: VLSI Technology, Inc., Sunnyvale, Calif.

[21] Appl. No.: 09/405,353

[22] Filed: Sep. 24, 1999

Related U.S. Application Data

[62] Division of application No. 09/025,429, Feb. 18, 1998, Pat. No. 6,031,270.
[51] Int. Cl.[7] ............................ H01L 29/76; H01L 29/94; H01L 31/062; H01L 31/113; H01L 31/119
[52] U.S. Cl. ............................................. 257/401; 257/358
[58] Field of Search ................................... 257/903, 904, 257/368, 401

[56] References Cited

U.S. PATENT DOCUMENTS

| | | |
|---|---|---|
| 4,207,615 | 6/1980 | Mar ........................................... 365/95 |
| 5,519,242 | 5/1996 | Avery . | |

OTHER PUBLICATIONS

Linewidth Control Effects on MOSFET ESD Robustness, S. Voldman, J. Never, S. Holmes, and J. Adkisson, p. 2.7.1–2.7.9, EOS/ESD Symposium 96–101.

ESD Protection In a Mixed–Voltage Interface and Multi–Rail Disconnection Power Grid Environment In 0.50 and 0.25–$\mu$m Channel Length CMOS Technologies, Steven H. Voldman, p. 3.4.1–3.4.10, EOS/ESD Symposium 94–125.

*Primary Examiner*—Ngân V. Ngô
*Attorney, Agent, or Firm*—Wells, St. John, Roberts, Gregory & Matkin, P.S.

[57] ABSTRACT

The present invention includes differential devices and methods of protecting a semiconductor device. One aspect of the present invention provides a differential device adapted to be coupled to a ground connection, the differential device comprising: a first interconnect; a second interconnect; a common diffusion region; a first MOS device coupled with the common diffusion region and the first interconnect; a second MOS device coupled with the common diffusion region and the second interconnect; and a tail MOS device coupled with the common diffusion region and adapted to be coupled to a ground connection.

42 Claims, 3 Drawing Sheets

DIFFERENTIAL DEVICES AND DIFFERENTIAL TRANSCEIVER

RELATED PATENT DATA

This patent resulted from a divisional application of U.S. patent application Ser. No. 09/025,429, filed Feb. 18, 1998, now U.S. Pat. No. 6,031,270, entitled "Differential Devices and Differential Transceiver", naming Jon R. Williamson et al. as inventors, the disclosure of which is incorporated by reference.

TECHNICAL FIELD

The present invention relates to differential devices and methods of protecting a semiconductor device.

BACKGROUND OF THE INVENTION

Differential transceivers are known in the art. Differential transceivers can be configured as monolithic integrated circuits designed for bi-directional data communications. Differential transceivers are generally used in high performance systems where maximum signal frequency is desired. For example, differential transceivers can be utilized in high performance applications including Low Voltage Differential Signalling (LVDS) and Pseudo Emitter Coupled Logic (PECL) applications.

Referring to FIG. 1, a conventional differential transceiver 10 is shown. Differential transceiver 10 includes plural input/output (I/O) pads 11, 12. Differential transceiver 10 additionally includes parallel MOS devices 13, 14 coupled with ground via a series MOS device 15. Parallel MOS devices 13, 14 are coupled with respective inputs 11, 12. Plural control lines 16, 17, 18 are utilized to control gates of respective MOS devices 13, 14, 15.

It is generally recognized that some semiconductor devices are susceptible to damage from electrical overstress (EOS) conditions. These conditions occur when the voltage or amperage ratings for a circuit are exceeded. Exemplary electrical overstress conditions include electrostatic discharge (ESD), transient conditions, latch-up, incorrect polarity connections, etc. The electrical overstress conditions are characterized by over-voltage and over-current stress events. Electrical overstress events can permanently damage integrated circuitry rendering a semiconductor device inoperable.

Accordingly, it is highly desired to protect semiconductor devices from electrostatic discharge and other electrical overstress conditions. Some solutions have attempted to minimize the accumulation of electrostatic charge to prevent electrostatic discharge. Exemplary solutions have included utilization of protective clothing such as shoes, smocks, etc. for workers in the semiconductor industry. Such approaches may alleviate the problem of electrostatic discharge to some extent, but consumers may not be aware of the potential damaging effects of electrostatic discharge upon the electronic components being handled.

In an effort to reduce effects from overstress events, conventional designs have added protection circuits 19, 20 in parallel with inputs 11, 12 as illustrated in FIG. 1. Exemplary protection devices 19, 20 include NMOS ESD protection circuitry added in parallel to the I/O connections 11, 12 of differential transceiver 10.

Implementing electrostatic discharge protection circuitry as illustrated in FIG. 1 has the drawback of adding capacitance to I/O pins 11, 12. Such additional capacitance is detrimental to high frequency signalling and degrades the performance of differential transceiver 10. This protection scheme is not appropriate in high performance applications such as LVDS and PECL.

Various approaches in the art have therefore been aimed at minimizing the capacitance added by ESD protection devices 19, 20. Exemplary ESD protection structures 19, 20 having minimal capacitance include low voltage semiconductor controlled rectifiers (SCR).

Other conventional constructions of differential transceivers provide MOS device 15 separated from the differential pair of MOS devices 13, 14. Separated differential transceiver constructions require other types of protection circuitry for adequate overstress event protection but suffer from the corresponding degradation of performance.

Therefore, there exists a need in the art to provide a differential device which overcomes the problems associated with the prior art devices and can be utilized in high performance applications.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
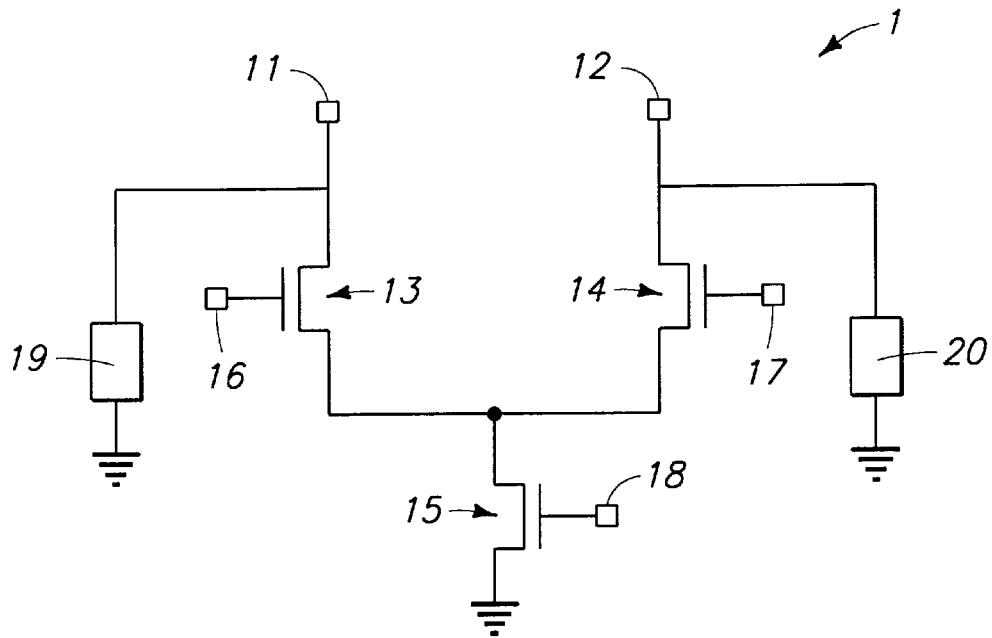
FIG. 1 is a schematic diagram of a conventional differential transceiver.

This disclosure of the invention is submitted in furtherance of the constitutional purposes of the U.S. Patent Laws "to promote the progress of science and useful arts" (Article 1, Section 8).

According to one aspect of the present invention, a differential device adapted to be coupled to ground comprises: a first interconnect; a second interconnect; a common diffusion region; a first MOS device coupled with the common diffusion region and the first interconnect; a second MOS device coupled with the common diffusion region and the second interconnect; and a tail MOS device coupled with the common diffusion region and adapted to be coupled to ground.

A second aspect of the present invention provides a differential device adapted to be coupled to ground comprising: a first interconnect; a second interconnect; a first cascode coupled with the first interconnect and adapted to be coupled with ground, the first cascode comprising a first MOS device coupled via a common diffusion region with a tail MOS device, the first cascode being configured to shunt a stress current from the first interconnect; and a second cascode coupled with the second interconnect and adapted to be coupled with ground, the second cascode comprising a second MOS device coupled via the common diffusion region with the tail MOS device, the second cascode being configured to shunt a stress current from the second interconnect.

Another aspect of the present invention provides a differential device adapted to be coupled to ground comprising:

a first interconnect; a second interconnect; a first cascode coupled to the first interconnect and adapted to be coupled to ground; and a second cascode coupled to the second interconnect and adapted to be coupled to ground, one of the first cascode and second cascode being configured to shunt a stress current from a respective first interconnect and second interconnect.

According to another aspect, a method of protecting a semiconductor device comprises: providing a differential device including a first cascode and a second cascode; coupling the first cascode with a first interconnect of a semiconductor device and ground; coupling the second cascode with a second interconnect of a semiconductor device and ground; and shunting a stress current using one of the first cascode and second cascode.

Another method of protecting a semiconductor device comprises: providing a differential device comprising a first MOS device, second MOS device and tail MOS device individually coupled with a common diffusion region; communicating signals using the first MOS device; communicating signals using the second MOS device; and shunting a stress current using the tail MOS device and one of the first and second MOS devices.

According to another aspect, a method of protecting a semiconductor device comprises: communicating signals using a first MOS device; communicating signals using a second MOS device; coupling the first and second MOS devices with a tail MOS device; and shunting a stress current using the tail MOS device and one of the first and second MOS devices.

Yet another embodiment of the present invention provides a method of protecting a semiconductor device comprising: communicating signals using a first MOS device; communicating signals using a second MOS device; coupling the first and second MOS devices with a common diffusion region; coupling a tail MOS device with the common diffusion region and ground; shunting a stress current using the tail MOS device and one of the first and second MOS devices; and providing a logic low digital signal to a gate of the one first and second MOS devices during the shunting.

Figure 2:
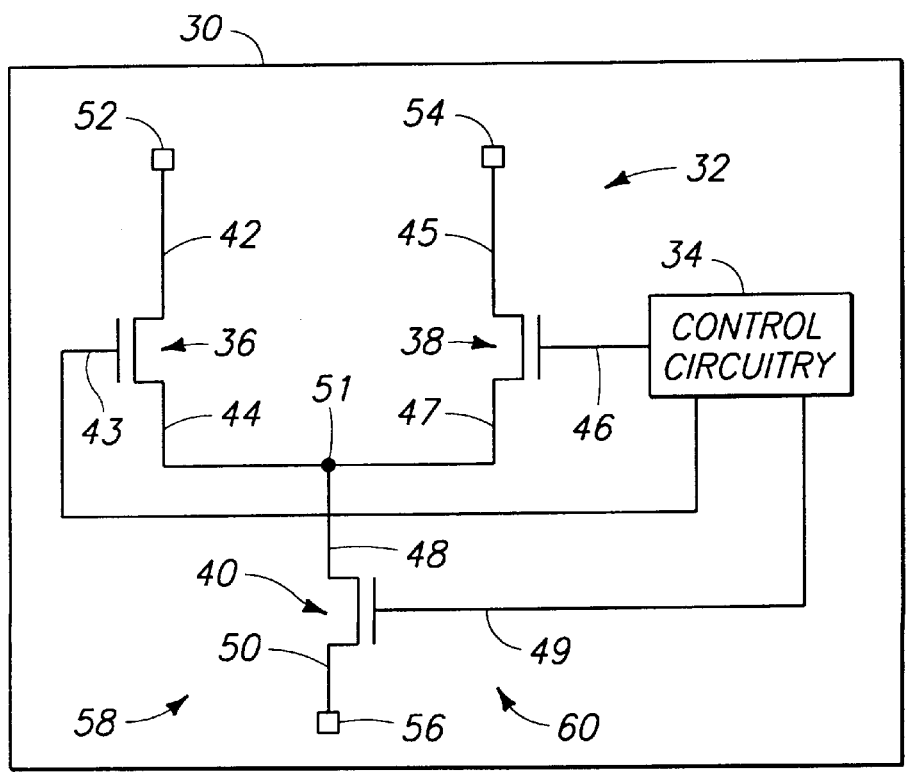
FIG. 2 is a schematic diagram of a semiconductor device and a differential device according to the present invention.

Referring to FIG. 2, a semiconductor device 30 is shown. Semiconductor device 30 includes a differential device 32 and control circuitry 34. The illustrated differential device comprises a differential metal-oxide semiconductor (MOS) transceiver. Differential device 32 includes parallel transistors 36, 38 and a tail transistor 40. Transistors 36, 38, 40 individually comprise MOS devices in the preferred embodiment of the invention.

MOS device 36 includes a drain 42, gate 43 and source 44. MOS device 38 includes a drain 45, gate 46 and source 47. Tail MOS device 40 includes a drain 48, gate 49 and source 50.

Differential device 32 includes first and second I/O interconnects or inputs 52, 54. Drain 42 of MOS device 36 is coupled with first input 52. Drain 45 of MOS device 38 is coupled with a second input 54. Inputs 52, 54 are configured for coupling with external circuitry and internal circuitry of semiconductor device 30 (not shown).

Source 44 of MOS device 36 is coupled with source 47 of MOS device 38 and drain 48 of tail MOS device 40. As described below, sources 44, 47 of MOS devices 36, 38 and drain 48 of tail MOS device 40 are coupled via a common diffusion region in a preferred embodiment of the invention. In particular, sources 44, 47 of MOS devices 36, 38 and drain 48 of MOS device 40 are coupled via a node 51. Node 51 is formed as the common diffusion region in the preferred embodiment.

Source 50 of tail MOS device 40 is adapted for coupling with a ground node connection 56 in the illustrated embodiment. Connection 56 is provided at a potential less than the voltage potential of inputs 52, 54 or common node 51. Connection 56 is preferably configured for coupling with an external ground reference.

Control circuitry 34 is coupled with gates 43, 46, 49 of respective MOS devices 36, 38, 40. Control circuitry 34 is configured to apply control signals to gates 43, 46, 49 to control the operation of respective MOS devices 36, 38, 40 and differential device 32.

Differential device 32 includes plural cascode structures 58, 60. Cascode structures 58, 60 are provided intermediate respective I/O connections 52, 54 and ground node 56. First cascode 58 comprises MOS device 36 and tail MOS device 40. Second cascode structure 60 comprises MOS device 38 and tail MOS device 40.

Cascode structures 58, 60 are individually configured to shunt stress currents present at a respective input 52, 54 to ground node 56. It is preferred to bias gates 43, 46 of respective MOS devices 36, 38 at logic low values during the shunting of stress currents via respective cascodes 58, 60. An isolation circuit can be coupled with gates 43, 46 to provide a logic low signal. Gates 43, 46 are electrically isolated is from I/O connections 52, 54. As such, gates 43, 46 should be biased low during electrostatic discharge events which typically occur prior to the coupling of semiconductor device 30 with power.

Biasing of gates 43, 46 at a logic low value is described in detail in a U.S. patent application titled "Protection Circuits and Methods of Protecting A Semiconductor Device", naming Jon R. Williamson, Edward Nowak and Emmanuel de Muizon as inventors, filed the same day as the present application, having attorney docket number VL5-027, assigned to the assignee of the present application and incorporated herein by reference.

Figure 3:
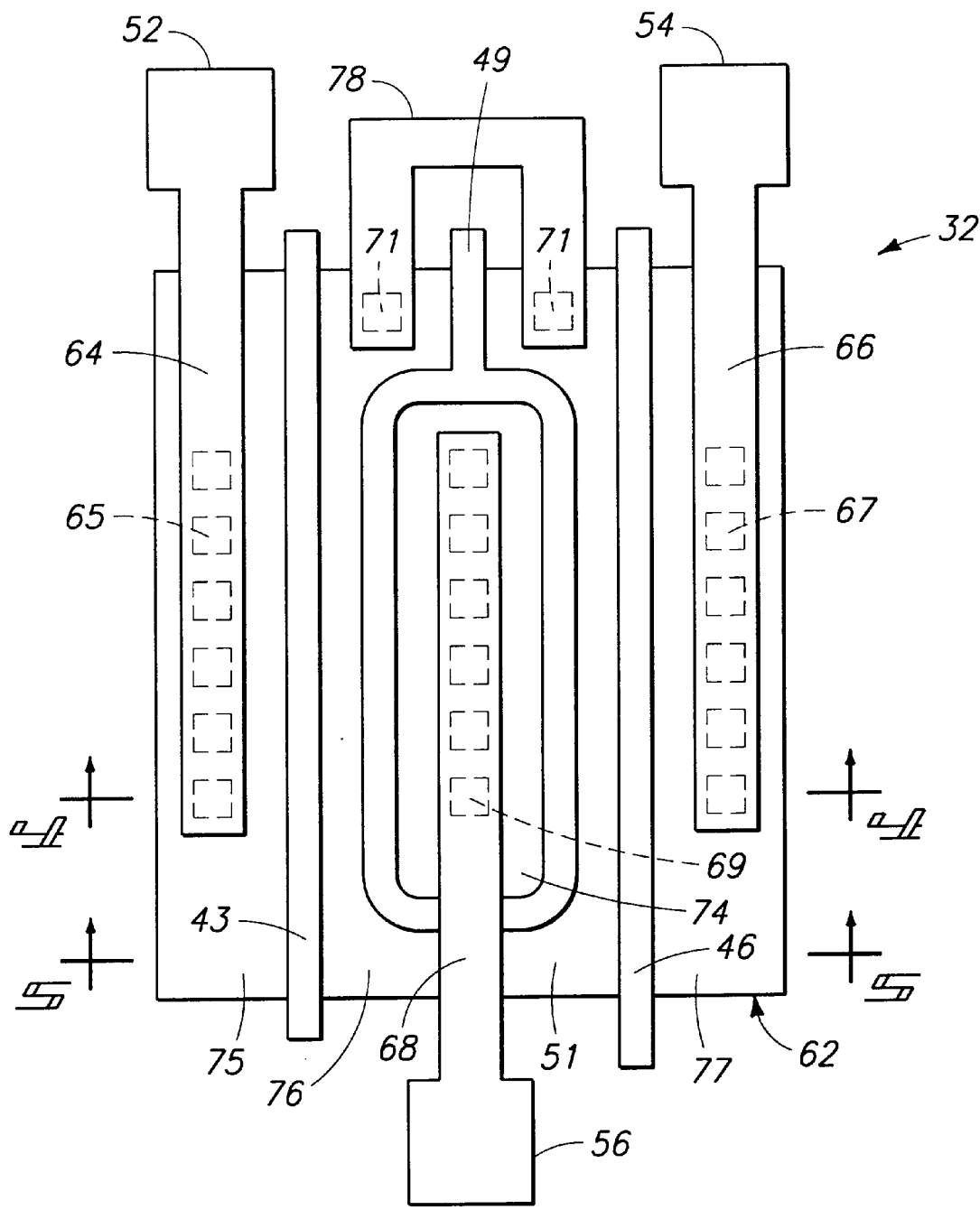
FIG. 3 is a top view of a physical representation of the differential device.

Referring to FIG. 3, a physical representation of one embodiment of differential device 32 is shown. The illustrated differential device 32 comprises a MOS device drawn in a common diffusion block 62 of a substrate (not shown in FIG. 3). MOS devices 36, 38, 40 individually comprise NMOS devices in the preferred embodiment of the invention.

Diffusion block 62 includes plural diffusion regions 74, 75, 76, 77 formed within the substrate. Diffusion regions 74–77 individually comprise respective n+ type diffusion regions and the substrate comprises a p type substrate in the described embodiment.

Inputs 52, 54 are coupled with diffusion regions 75, 77 via respective metalization connections 64, 66. Plural contacts 65, 67 can be utilized to couple respective metalization contacts 64, 66 with diffusion regions 75, 77.

Ground node connection 56 is also coupled with a metalization connection 68. Connection 68 is electrically coupled with diffusion region 74 via a plurality of contacts 69 in the illustrated embodiment of differential device 32. Contacts 65, 67 are provided intermediate respective connections 64, 66 and respective diffusion regions 75, 77, and are shown in phantom in FIG. 3. Contacts 69 are shown in phantom and provided intermediate connection 68 and diffusion region 74.

Gates 43, 46, 49 of respective MOS devices 36, 38, 40 are formed as polysilicon connections in the described embodiment. Polysilicon gate 43 and a portion of gate 49 are provided intermediate metalization connections 64, 68. Polysilicon gate 46 and another portion of gate 49 are provided intermediate metalization connections 66, 68.

Polysilicon gate 49 of MOS device 40 forms a racetrack configuration about contacts 69 in the described embodiment. Gate 49 encircles or encloses diffusion region 74 electrically coupled with contacts 69. Gate 49 is configured to control electrical coupling of interconnections 52, 54 with ground node 56.

Gate 43 defines diffusion region 75 of diffusion block 62. Diffusion region 75 is electrically coupled with input 52 and connection 64 via contacts 65. Gate 46 defines diffusion region 77 of diffusion block 62. Diffusion region 77 is coupled with input 54 and connection 66 via contacts 67.

Gates 43, 46, 49 defines a common diffusion node or region 76. Common diffusion region 76 corresponds to node 51 of FIG. 2. Common diffusion region 76 is outside enclosed gate 49 and intermediate gates 43, 46.

It is preferred to decrease or minimize the resistance of common diffusion region 76 to provide high performance operation of differential device 32. In one embodiment, a metalization connection or metal clip 78 is coupled with diffusion region 76 to reduce the resistance of common diffusion region or node 76. Metal clip 78 is coupled with common diffusion node 76 via plural conductive contacts 71 in the illustrated embodiment.

Additional methods of reducing the resistance of common diffusion region 76 include increasing the n+ type diffusion area width of common diffusion region 76, and/or utilizing full salicide processing. Metal clip 78 is tapped into different regions of common diffusion region 76 in other embodiments.

The resistance of common diffusion node 76 can be minimized to a sufficient degree to avoid significant interference with high performance operation of differential device 32. More specifically, the current passing through common diffusion region 76 and the area resistance of metal clip 78 is the differential signalling current. The resistance can be minimized by providing additional contacts 71. Other configurations can be utilized to minimize the resistance of common diffusion node 76.

Figure 4:
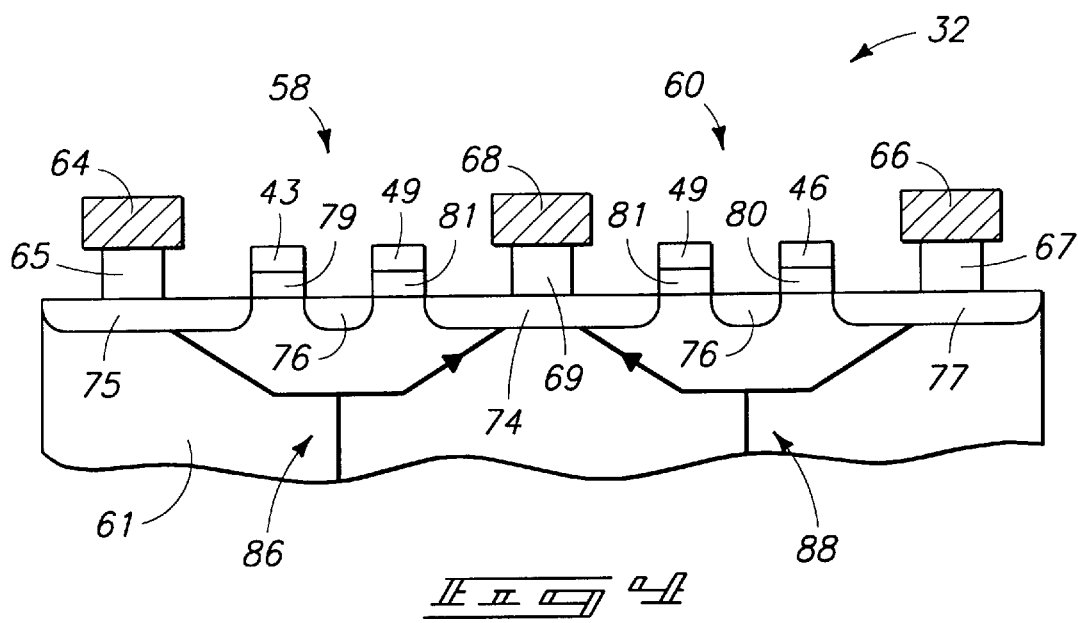
FIG. 4 is a cross-sectional view taken along lines 4—4 of FIG. 3.

Referring to FIG. 4, diffusion regions 74, 75, 76, 77 of differential device 32 are shown. Gates 43, 49 control electrical coupling of metalization connections 64, 68 corresponding to first input 52 and ground reference 56. Gates 46, 49 control electrical coupling of metalization connections 66, 68 corresponding to second input 54 and ground reference 56. Control circuitry 34 of FIG. 2 is operable to control electrical coupling of interconnections 52, 54 and ground node 56 by controlling gates 43, 46, 49.

Differential device 32 includes plural gate oxide insulators 79, 80, 81. Gate oxide insulators 79, 80, 81 operate to electrically insulate respective gates 43, 46, 49 from substrate 61 and diffusion regions 74, 75, 76, 77.

Differential device 32 is configured such that a parasitic bipolar junction transistor (BJT) 86 is triggered responsive to the presence of a stress current, such as an electrostatic discharge current, at input 52. Parasitic transistor 86 operates to shunt the stress currents from first input 52 to ground node 56 via respective metalization connections 64, 68. Differential device 32 is also preferably configured such that another parasitic bipolar junction transistor (BJT) 88 is triggered responsive to the presence of a stress current at second input 54. Parasitic transistor 88 operates to shunt the stress currents from second input 54 to ground node 56 via respective metalization connections 66, 68.

Gate 43 of first MOS device 58 is preferably provided at one of a logic low value or a floating value during an overstress event present at first input 52. Providing gate 43 of MOS device 58 at a logic low value improves the response time for triggering of parasitic transistor 86 to shunt stress currents present at input 52 to ground.

Similarly, gate 46 of second MOS device 60 is preferably provided at one of a logic low value or a floating value during an overstress event present at second input 54. Providing gate 46 of MOS device 60 at a logic low value improves the response time for triggering of parasitic transistor 88 to shunt stress currents present at input 54.

Figure 5:
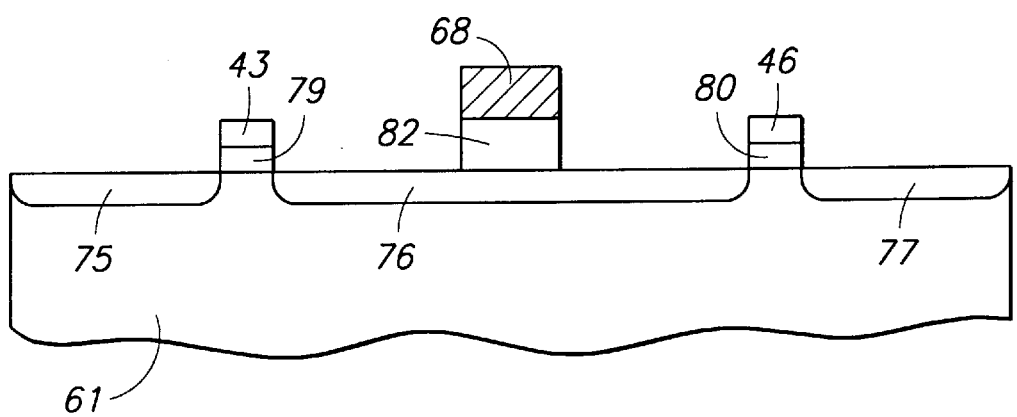
FIG. 5 is a cross-sectional view taken along lines 5—5 of FIG. 3.

Referring to FIG. 5, the illustrated differential device includes an insulator 82. Insulator 82 operates to insulate metalization connection 68 from common diffusion region 76. Insulator 82 comprises silicon dioxide in the described embodiment. Other insulative materials, preferably having a similar dielectric constant as silicon dioxide, can be utilized. Diffusion regions 75, 76, 77 of differential transceiver 32 are also shown in FIG. 5.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A differential device adapted to be coupled to a ground connection, the differential device comprising:
a first interconnect;
a second interconnect;
a common diffusion region;
a first MOS device coupled with the common diffusion region and the first interconnect;
a second MOS device coupled with the common diffusion region and the second interconnect; and
a tail MOS device coupled with the common diffusion region and adapted to be coupled to a ground connection.

2. The differential device according to claim 1 wherein the tail MOS device and at least one of the first and second MOS devices are configured to shunt stress currents.

3. The differential device according to claim 1 wherein the tail MOS device and at least one of the first and second MOS devices are configured to shunt electrostatic discharge currents.

4. The differential device according to claim 1 wherein the MOS devices individually include a drain, a source and a gate.

5. The differential device according to claim 4 further comprising plural control connections individually coupled with a gate of one of the first MOS device and second MOS device.

6. The differential device according to claim 5 wherein the control connections coupled with the first MOS device and second MOS device are electrically isolated from a stress current present at the respective first interconnect and second interconnect.

7. The differential device according to claim 4 further comprising a ground connection.

8. The differential device according to claim 7 wherein a gate of the tail MOS device selectively electrically isolates the ground connection from the common diffusion region.

9. The differential device according to claim 4 wherein a source of the first MOS device, a source of the second MOS device and a drain of the tail MOS device are electrically coupled with the common diffusion region.

10. The differential device according to claim 1 wherein the first MOS device, second MOS device and tail MOS device are formed in a common diffusion block.

11. The differential device according to claim 1 further comprising a metal connection configured to reduce the resistance of the common diffusion region.

12. The differential device according to claim 1 wherein the MOS devices comprise NMOS devices.

13. A differential device adapted to be coupled to a ground connection, the differential device comprising:

a first interconnect:

a second interconnect;

a first cascode coupled with the first interconnect and adapted to be coupled with a ground connection, the first cascode comprising a first MOS device coupled via a common diffusion region with a tail MOS device, the first cascode being configured to shunt a stress current from the first interconnect; and a second cascode coupled with the second interconnect and adapted to be coupled with a ground connection, the second cascode comprising a second MOS device coupled via the common diffusion region with the tail MOS device, the second cascode being configured to shunt a stress current from the second interconnect.

14. The differential device according to claim 13 wherein the cascodes are configured to shunt electrostatic discharge currents.

15. The differential device according to claim 13 wherein the tail MOS device and at least one of the first and second MOS devices are configured to shunt stress currents.

16. The differential device according to claim 13 wherein the MOS devices individually include a drain, a source and a gate.

17. The differential device according to claim 16 further comprising plural control connections individually coupled with a gate of one of the first MOS device and second MOS device.

18. The differential device according to claim 17 wherein the control connections coupled with the first MOS device and second MOS device are electrically isolated from a stress current present at the respective first interconnect and second interconnect.

19. The differential device according to claim 16 further comprising a ground connection.

20. The differential device according to claim 19 wherein a gate of the tail MOS device selectively electrically isolates the ground connection from the common diffusion region.

21. The differential device according to claim 16 wherein a source of the first MOS device, a source of the second MOS device and a drain of the tail MOS device are electrically coupled with the common diffusion region.

22. The differential device according to claim 13 wherein the first MOS device, second MOS device and tail MOS device are formed in a common diffusion block.

23. The differential device according to claim 13 further comprising a metal connection configured to reduce the resistance of the common diffusion region.

24. The differential device according to claim 13 wherein the MOS devices comprise NMOS devices.

25. The differential device according to claim 13 wherein the cascodes are individually configured to form a parasitic transistor to shunt a stress current.

26. A differential device adapted to be coupled to a ground connection, the differential device comprising:

a first interconnect;

a second interconnect;

a first cascode coupled to the first interconnect and adapted to be coupled to a ground connection; and a second cascode coupled to the second interconnect and adapted to be coupled to a ground connection, one of the first cascode and second cascode being configured to shunt a stress current from a respective first interconnect and second interconnect.

27. The differential device according to claim 26 wherein the cascodes are configured to shunt electrostatic discharge currents.

28. The differential device according to claim 26 wherein the first cascode and second cascode respectively include a first MOS device and second MOS device coupled with a tail MOS device.

29. The differential device according to claim 28 wherein the first MOS device, second MOS device and tail MOS device are formed in a common diffusion block.

30. The differential device according to claim 28 wherein the MOS devices individually include a drain, a source and a gate.

31. The differential device according to claim 28 wherein the first MOS device, second MOS device and tail MOS device are coupled with a common diffusion region.

32. The differential device according to claim 31 further comprising a ground connection.

33. The differential device according to claim 32 wherein a gate of the tail MOS device selectively electrically isolates the ground connection from the common diffusion region.

34. The differential device according to claim 31 wherein a source of the first MOS device, a source of the second MOS device and a drain of the tail MOS device are electrically coupled with the common diffusion region.

35. The differential device according to claim 31 further comprising a metal connection configured to reduce the resistance of the common diffusion region.

36. The differential device according to claim 26 wherein the cascodes are individually configured to form a parasitic transistor to shunt a stress current.

37. A differential device configured to shunt stress currents from an interconnect to a ground connection.

38. The differential device according to claim 37 wherein the differential device includes plural cascodes individually configured to shunt stress currents.

39. A differential transceiver adapted to be coupled to a ground connection, the differential transceiver comprising:

a first interconnect;

a second interconnect;

a first cascode coupled with the first interconnect and adapted to be coupled with a ground connection, the first cascode comprising a first NMOS device coupled via a common diffusion region with a tail NMOS device, the first and tail NMOS devices individually including a drain and source, the drain of the first NMOS device being coupled to the first interconnect and the source of the first NMOS device being coupled with the common diffusion region, the drain of the tail MOS device being coupled with the common diffusion region and the source of the tail MOS device being adapted to be coupled to a ground connection, the first cascode being configured to shunt an electrostatic discharge current from the first interconnect; and a second cascode coupled with the second interconnect and adapted to be coupled with a ground connection, the first cascode comprising a second NMOS device coupled via the common diffusion region with the tail NMOS device, the second NMOS device individually including a drain and source, the drain of the second NMOS device being coupled to the second interconnect and the source of the second NMOS device being coupled with the common diffusion region, the second cascode being configured to shunt an electrostatic discharge current from the second interconnect.

40. The differential device according to claim 1 wherein the common diffusion region substantially surrounds a diffusion region comprising a source of the tail MOS device.

41. The differential device according to claim 13 wherein the common diffusion region substantially surrounds a diffusion region comprising a source of the tail MOS device.

42. The differential device according to claim 31 wherein the common diffusion region substantially surrounds a diffusion region comprising a source of the tail MOS device.

* * * * *